United States Patent
Atia et al.

(10) Patent No.: US 6,543,114 B2
(45) Date of Patent: Apr. 8, 2003

(54) MANUFACTURING SYSTEM USING SOLDER SELF-ALIGNMENT WITH OPTICAL COMPONENT DEFORMATION FINE ALIGNMENT

(75) Inventors: Walid A. Atia, Lexington, MA (US); Steven D. Conover, Chelmsford, MA (US); Eric E. Fitch, Medford, MA (US); Sean P. O'Connor, Wollaston, MA (US); Randal A. Murdza, North Andover, MA (US)

(73) Assignee: Axsun Technologies, Inc., Billerica, MA (US)

( * ) Notice: Subject to any disclaimer, the term of this patent is extended or adjusted under 35 U.S.C. 154(b) by 148 days.

(21) Appl. No.: 09/802,731

(22) Filed: Mar. 8, 2001

(65) Prior Publication Data

US 2002/0124375 A1 Sep. 12, 2002

(51) Int. Cl.⁷ .............................................. B23Q 17/00
(52) U.S. Cl. ............................... 29/407.04; 29/407.05; 29/407.09; 29/445; 29/840; 228/180.22; 228/155
(58) Field of Search .......................... 29/445, 464, 468, 29/469.5, 407.01, 407.04, 407.05, 407.09, 407.1, 840; 228/180.22, 103, 105, 155

(56) References Cited

U.S. PATENT DOCUMENTS

| | | | | |
|---|---|---|---|---|
| 4,342,090 A | * | 7/1982 | Caccoma et al. | 29/407.04 |
| 4,878,611 A | * | 11/1989 | LoVasco et al. | 228/180.22 |
| 5,249,733 A | * | 10/1993 | Brady et al. | 228/180.22 |
| 5,257,336 A | * | 10/1993 | Dautartas | 385/93 |
| 5,661,831 A | * | 8/1997 | Sasaki et al. | 385/49 |
| 5,700,987 A | * | 12/1997 | Basavanhally | 219/56.1 |
| 6,112,001 A | * | 8/2000 | Kishida et al. | 385/49 |
| 6,205,264 B1 | * | 3/2001 | Jin et al. | 385/14 |
| 6,375,060 B1 | * | 4/2002 | Silhavy | 228/180.22 |
| 2002/0084308 A1 | * | 7/2002 | Imai et al. | 228/102 |
| 2002/0145032 A1 | * | 10/2002 | Khandros et al. | 228/155 |

OTHER PUBLICATIONS

Bingzhi, Su; Gershovich, M.; and Lee, Y.C., "Gas Flow Effect on Precision Solder Self–Alignment," Department of Mechanical Engineering, University of Colorado, Boulder, CO.

Kuhmann, J.F.; and Pech, D., "In Situ Observation of the Self–Alignment During FC–Bonding Under Vacuum with and without $H_2$," IEEE Photonics Technology Letters, vol. 8, No. 12, Dec. 1996, pp. 1665–1667.

Morozova, N.D.; Liew, L.A.; Zhang, W.; Irwin, R.; Su, Bingzhi; Lee, Y.C., "Controlled Solder Self–alignment Sequence for an Optoelectronic Module without Mechanical Stops," Department of Mechanical Engineering and Center for Optoelectronic Computing Systems, University of Colorado, Boulder, CO.

* cited by examiner

Primary Examiner—David P. Bryant
(74) Attorney, Agent, or Firm—J. Grant Houston

(57) ABSTRACT

A process for assembling micro-optical systems, such as optoelectronic and/or fiber optic components uses solder self-alignment to achieve a coarse, passive alignment of optical components relative to the optical bench. The fine, final alignment is performed using plastic deformation of the optical components to thereby improve the alignment of the optical components. As a result, the sub-micrometer alignment accuracies are attainable, if required.

18 Claims, 6 Drawing Sheets

MANUFACTURING SYSTEM USING SOLDER SELF-ALIGNMENT WITH OPTICAL COMPONENT DEFORMATION FINE ALIGNMENT

BACKGROUND OF THE INVENTION

Solder self-alignment is a technique for aligning devices, such as semiconductor chips, to carriers, such as packages. Solder is predeposited on the carriers typically to lithographic precision to form bond pads. The devices are placed on bond pads to form a precursor structure, which is then placed in a solder reflow oven where the solder pads are heated to a liquidous state. The resulting surface tension in the liquid solder pulls the devices into alignment with the bond pads and thus the carriers.

Solder self-alignment has also been used in optoelectronic device manufacture. In these applications, optical components, such as an active device, e.g., laser chip, or passive devices, e.g., lenses or filters, are placed on bond pads, which have been predeposited on optical benches or submounts. Then, these precursor structures are placed in a solder reflow oven where the solder is heated to a liquidous state. The optical components are then pulled into alignment by surface tension on the optical benches.

SUMMARY OF THE INVENTION

With well-characterized processes, optical component alignment using solder self-alignment techniques is effective to align the optical components relative to the benches to accuracies of about 10 micrometers ($\mu$m). As a result, it competes with other passive alignment processes, such as registration features and/or installation by pick-and-place machines, in high volume manufacturing processes. The advantage is that it can be implemented quickly using manual placement of the optical components on the solder pads.

The problem with solder self-alignment, however, is its alignment accuracy limitation. Many carrier-class fiber optic components require alignment accuracy of a few micrometers to sub-micrometer accuracy. Existing solder alignment processes generally cannot achieve such tolerances.

The present invention is directed to a process for assembling micro-optical systems, such as optoelectronic and/or fiber optic components. It uses solder self-alignment to achieve a coarse, passive alignment of optical components relative to the optical bench. The fine, final alignment, however, is performed using plastic deformation of the optical components to thereby improve the alignment of the optical components. As a result, alignment accuracies of a few micrometers to sub-micrometer are attainable, if required.

In general, according to one aspect, the invention features a process for assembling micro-optical systems. This process comprises depositing pads at locations on optical benches determined by intended engagement points between optical components and the optical benches. The optical components are then placed on these solder pads. A solder reflow process is then performed to join the optical components to the optical benches using the solder pads. During this process, self-alignment of the optical components is allowed using the solder surface tension. Finally, according to the invention, after solidification of the solder, the alignment of the optical components is improved by plastically deforming the components on the benches.

In typical applications, the solder reflow process results in the positioning of the optical components to accuracies of between 2 and 10 micrometers. Then, the final step of improving the alignment using plastic deformation results in the alignment of the components to about 1 micrometer or better. In one implementation, the plastic deformation is performed in an active alignment process. Specifically, optical signals are directed to the optical component and the optical components deformed in response to the optical signals after interaction with the optical components.

In another implementation, the step of plastically deforming the optical components comprises deforming the optical components in response to metrology data describing in the positions of the optical components relative to the benches and also so in response to the desired positions of the optical components.

To facilitate the solder attachment process, in some embodiments, solder or metal pads are predeposited on feet of the optical components. Alternatively, or in addition, solder preforms can be further placed between the optical components and the solder pads of the benches.

In one example, the optical components are placed on the solder pads manually. Vacuum wands are preferably used to manipulate the small optical components.

In alternative processes, pick-and-place machines are used, such as flip chip bonders, to place the optical components on the benches.

Further, lateral registration features are helpful in some implementations to facilitate the initial placement of the optical components on the pads. Registration features can also be further used to control the subsequent self-alignment process. These registration features are formed on the bench surface in one implementation. Alternatively, separate templates are used.

In some implementations, magnetic fixturing is used at least after the placement of the optical components on the optical bench to hold the optical components on the optical bench. This is typically accomplished by providing optical components that include mounting structures that are made from a ferromagnetic material, such as nickel or iron. A magnetic field is oriented at least partially orthogonal to the bench in a downward direction toward the bench.

In general, according to another aspect, the invention also features an unpopulated bench precursor structure. This structure comprises a bench. Typically, the benches are manufactured from a temperature stable substance such as silicon or beryllium nitride, or aluminum nitride. The pads are predeposited on the bench at locations determined by desired engagement points between the optical components and the optical bench. Registration features are further provided on the bench in or near the solder pads for supporting the optical components at a predetermined position vertically on the bench.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
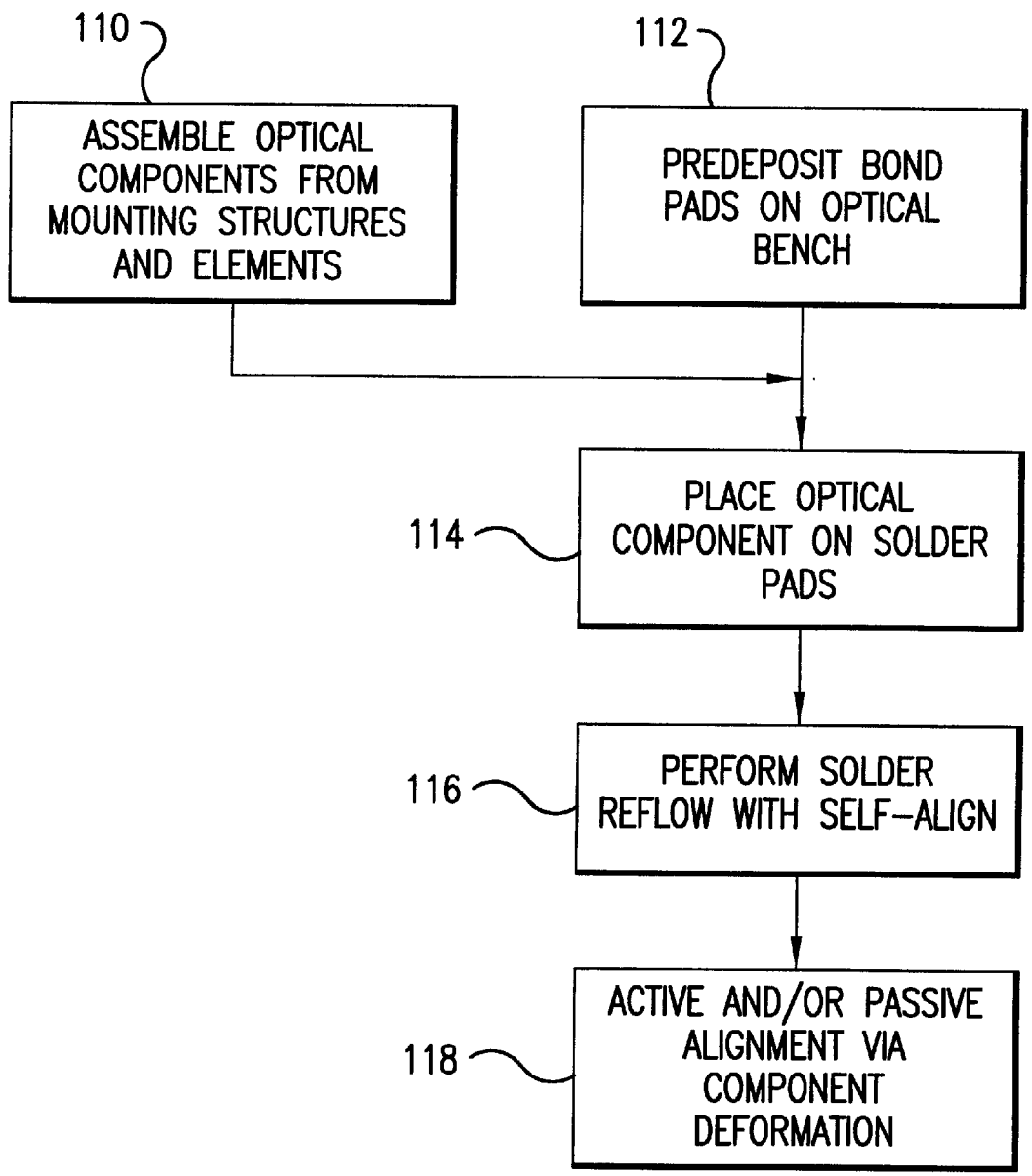
FIG. 1 is a flow diagram illustrating one manufacturing process using solder self-alignment with optical component deformation fine alignment, according to the present invention.

FIG. 1 is a flow diagram illustrating an optical system manufacturing process embodying the principles of the present invention.

Specifically, two preassembly or subassembly steps are typically performed, according to the present implementation.

First, optical components are assembled from optical mounting structures and optical elements in step 110 as required. This component level assembly is avoided in some implementations, however, by monolithic fabrication of the components.

Further, metal or other material is deposited on the targeted optical bench in step 112 to form the bond pads.

In some embodiments, the bond pad is defined by a gold layer. For some optical benches, actually a multi layer structure is used, such as a titanium or chromium adhesion layer, a nickel or platinum barrier layer, and a gold layer. This gold layer defines the bond pad.

Solder preforms are then placed on the defined pad. Generally, PbSnAu, AuSn, InPbAg, or InPdAu solders are currently used. Alternatively, predeposited solder is used, but typically organic binder materials are included in these solders. These organics are not desirable in optoelectronic applications.

Reactive solders that are directly deposited on the bench to form the bond pads are still another option.

Figure 2A:
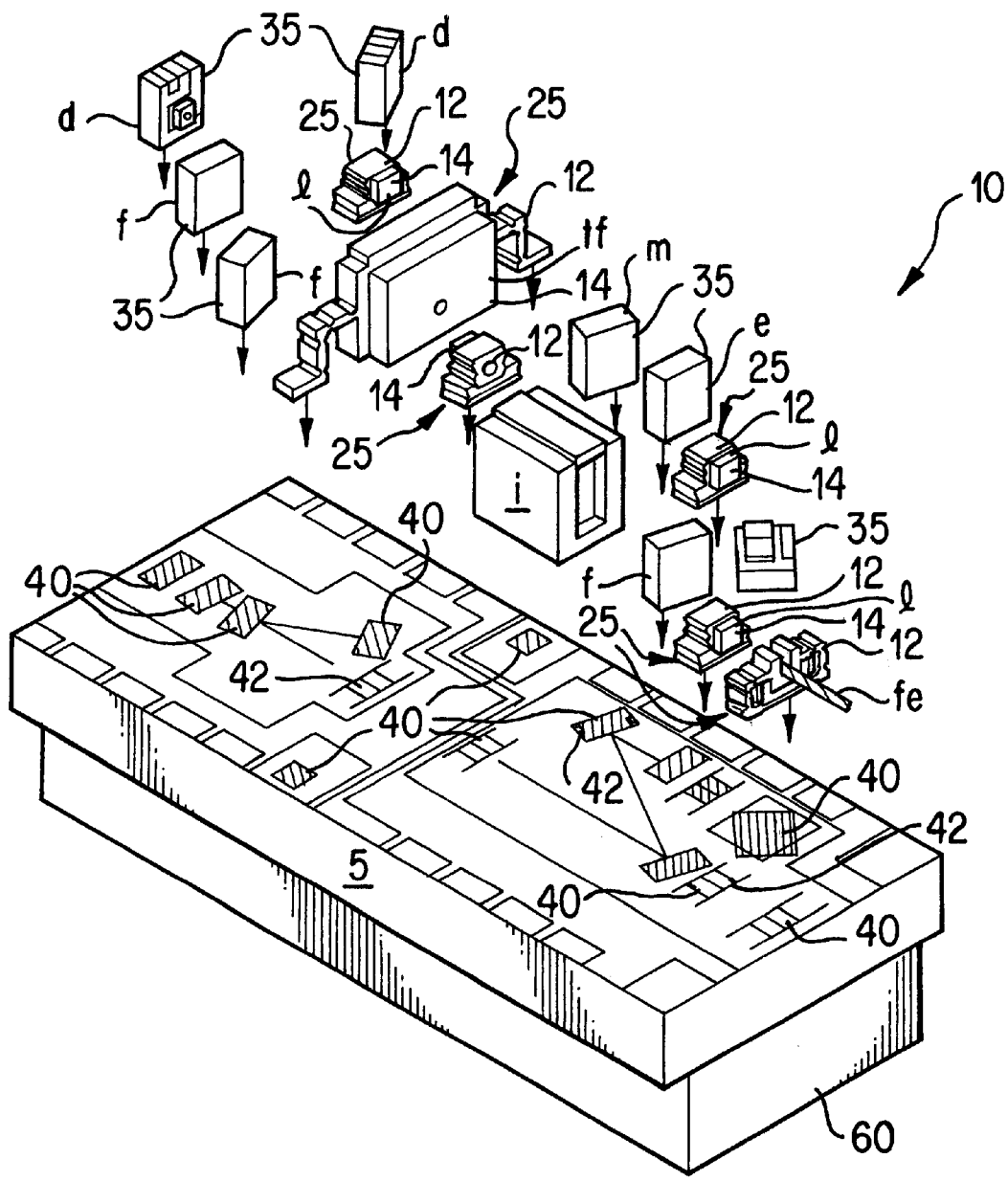
FIG. 2A is a perspective view showing an unpopulated optical bench with predeposited pads forming an unpopulated optical bench precursor structure with the optical components schematically shown ready for installation or placement on the pads of the bench, according to the present invention.

FIG. 2A illustrates the result of the subassembly step.

In the exemplary optical subsystem 10, the optical components are divided into two classes: 1) high precision alignment components 25; 2) and low precision alignment components 35.

For the low precision components 35, alignment is less critical. Examples include detectors d, WDM filters f, etalons e, isolators i, and fold mirrors m.

The high precision components 25 require additional alignment beyond that available using only solder self-alignment. Examples of these components include lenses 1, fiber endfaces fe, and micro electromechanical systems (MEMS) devices such tunable filters tf.

In the illustrated example, the high precision components 25 each comprise an optical component mounting structure 12 and an optical element 14. In one example, the optical component mounting structures are manufactured using the LIGA process. LIGA is a German acronym that stands for lithography, plating, and molding. Currently, the optical elements 14 include lenses, which are manufactured using an etching and/or mass transport processes in gallium phosphide or silicon, and MEMS devices. Preferably, the optical elements 14 are solder bonded to the respective mounting structures 12. Although in other implementations, the components are monolithically formed using, for example, deep RIE and metal deposition.

In some implementations, the mounting structures or at least their feet are coated to facilitate the solder bonding process. In one example, they are gold coated. Solder can also be predeposited onto the feet of the mounting structures.

For the bench preassembly step 112, solder or metal material is deposited on the optical bench 5 to thereby form the bond pads 40 on an unpopulated optical bench precursor structure. These pads 40 are deposited on the bench at locations determined by the desired engagement points between the optical components 25, 35 and the optical bench 5.

In one embodiment, spacers 42 are further provided on the bench 5, in or near the solder pads 40 for supporting the optical components 25, 35 at predetermined positions vertically relative to the bench. This further confines the movement and alignment of the optical components in the vertical dimension, with the lateral dimensions being determined by the surface tension during the reflow process as detailed below.

Referring back to FIG. 1, in the placement step 114, the optical components are placed on the optical bench, as illustrated in FIG. 2 by the arrows.

In one embodiment, the optical components are placed manually on the solder pads using, for example, vacuum wands.

In an alternative embodiment, the optical components are placed on the solder pads using a pick-and-place machine. Flip chip bonders are capable for the required precision placement. In one example, the optical components 25 are tack bonded to the bond pads of the optical bench.

In one implementation, a permanent magnet or electromagnet 60 is used to hold the components 25, 35 on the bench 5 after placement. The magnet 60 is oriented so that the magnetic field is orthogonal to the benches top surface or has a vector component in that direction.

Figure 2B:
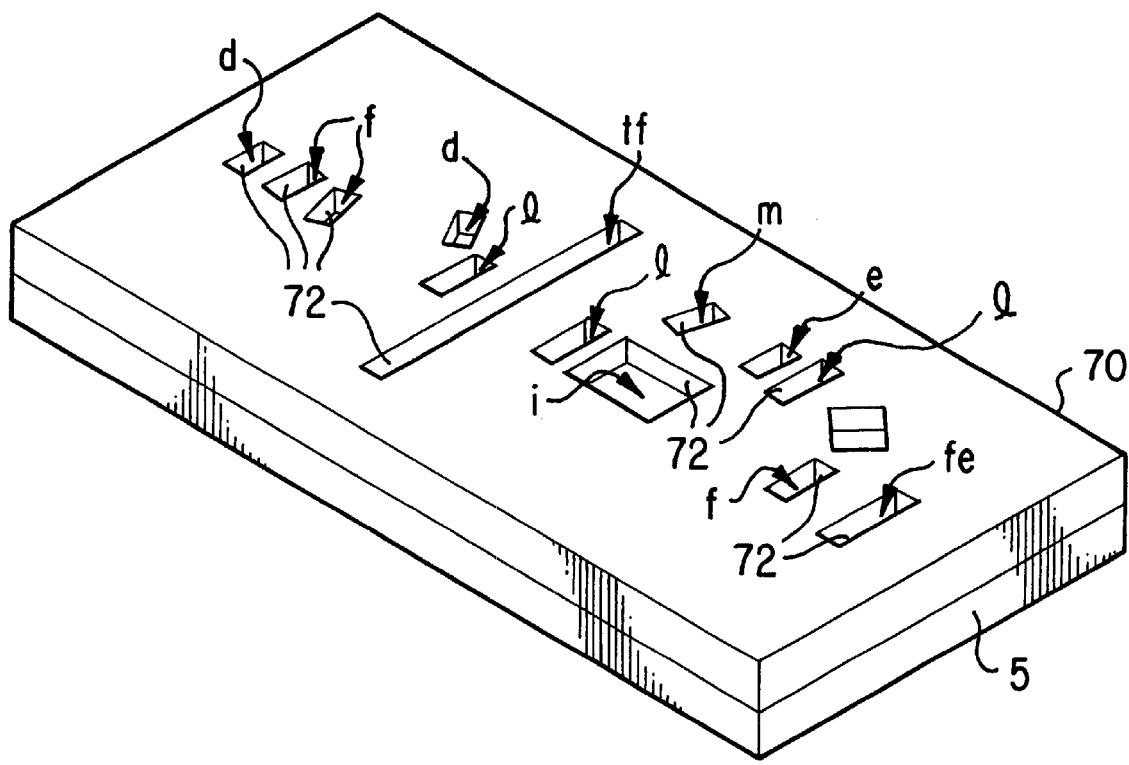
FIG. 2B is a perspective view of a bench template according to the present invention.

FIG. 2B illustrates a placement jig or template 70 that is used to facilitate the placement of the optical components on the bench 5. Specifically, the template 70 is aligned over the bench 5. The template 70 has through-holes or registration features 72 into which the optical component are inserted so that they are aligned over the bond pads on the bench 5. The jig 70 can be manufactured from graphite or silicon.

Figure 3:
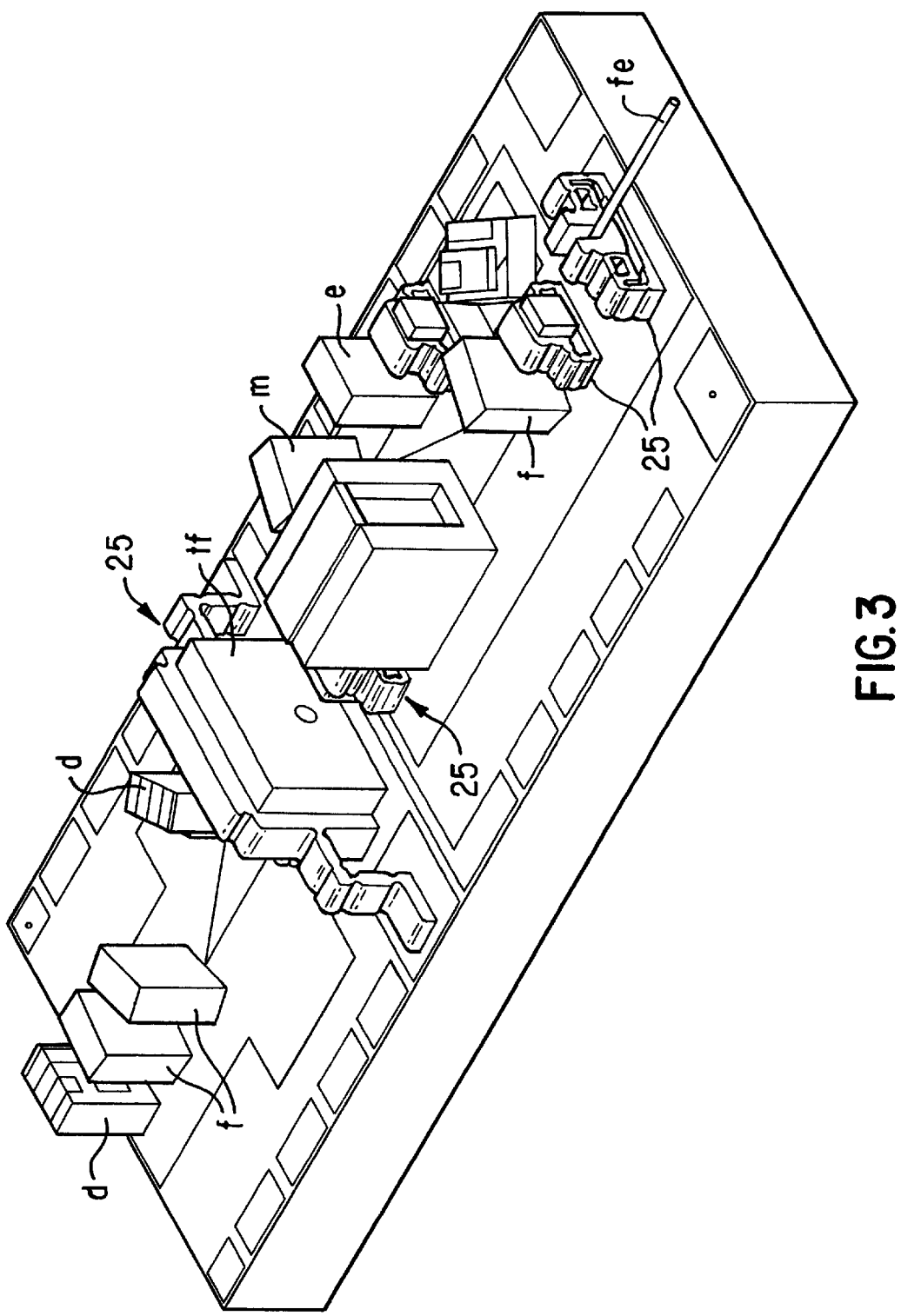
FIG. 3 is a perspective view showing the populated optical bench.

FIG. 3 illustrates the result of the placement step 114, with the optical bench 5 having received the optical components 25, 35.

Referring back to FIG. 1, after the placement step, the bench with optical components is placed in a solder reflow oven or other reflow device. Ovens are useful because they create the optimum solder reflow environments in which the solder is raised to a liquidous temperature in an forming gas atmosphere so that the components are simultaneously bonded to the optical bench while the solder surface tension pulls the optical components into alignment relative to the solder pads. Typically, this can align the optical components on the optical benches to accuracies of 2 to 10 micrometers.

Figure 4:
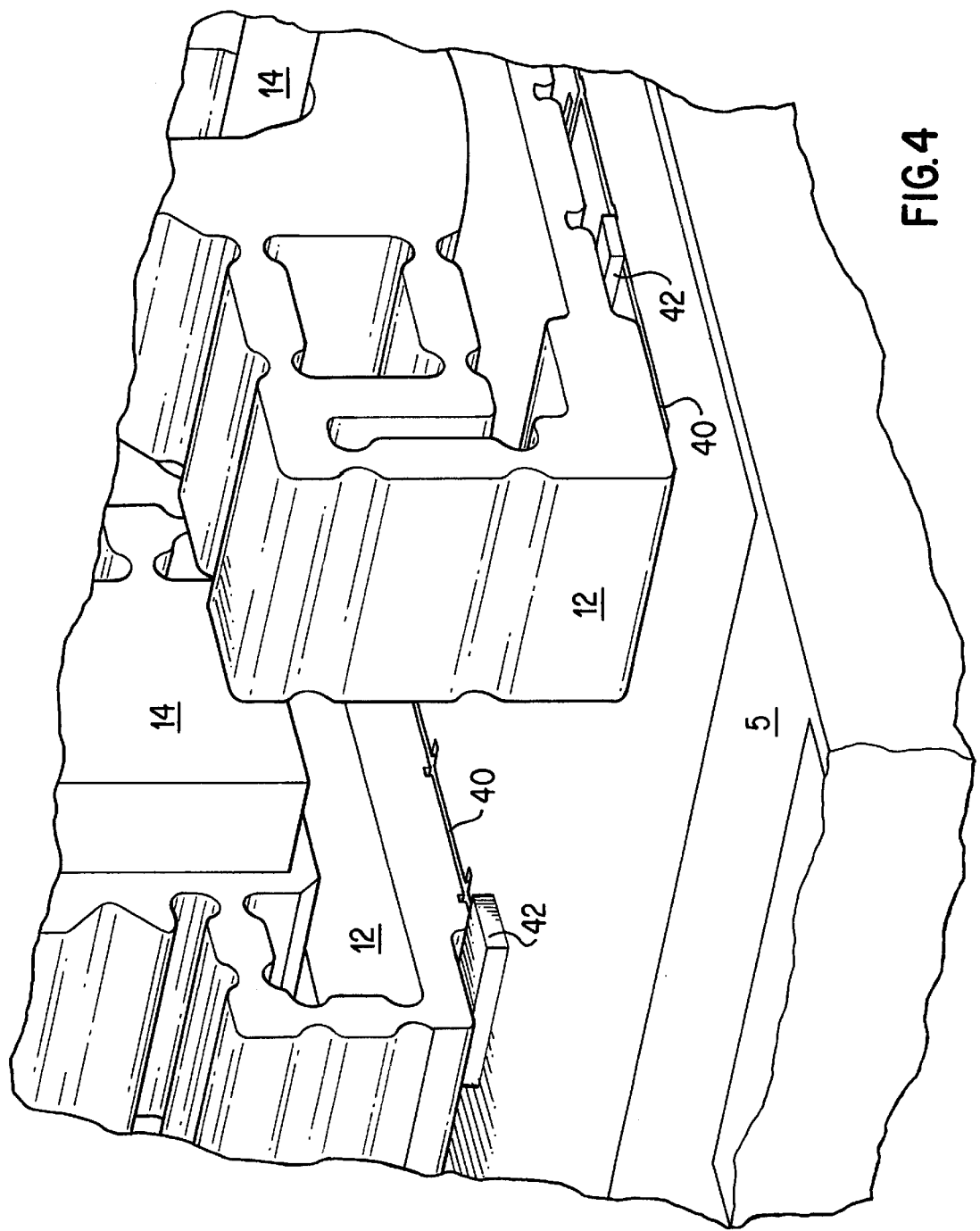
FIG. 4 is a detailed perspective view showing the interaction between the bench spacers and optical components after solder reflow.

FIG. 4 illustrates the result of the reflow process in which the various optical components 25, 35 are solder bonded to the bench 5. This detailed view further illustrates the operation of the spacers 42. Specifically spacers 42 function to act is stand-offs between the bench 5 and the mounting structures 12 so that they are fixed at a predetermined height above the bench even after solidification, i.e., shrinkage, of the solder in the bond pads 40.

Finally, in step 118, active and/or passive fine alignment is performed by plastic deformation of the high precision optical components 25.

Figure 5:
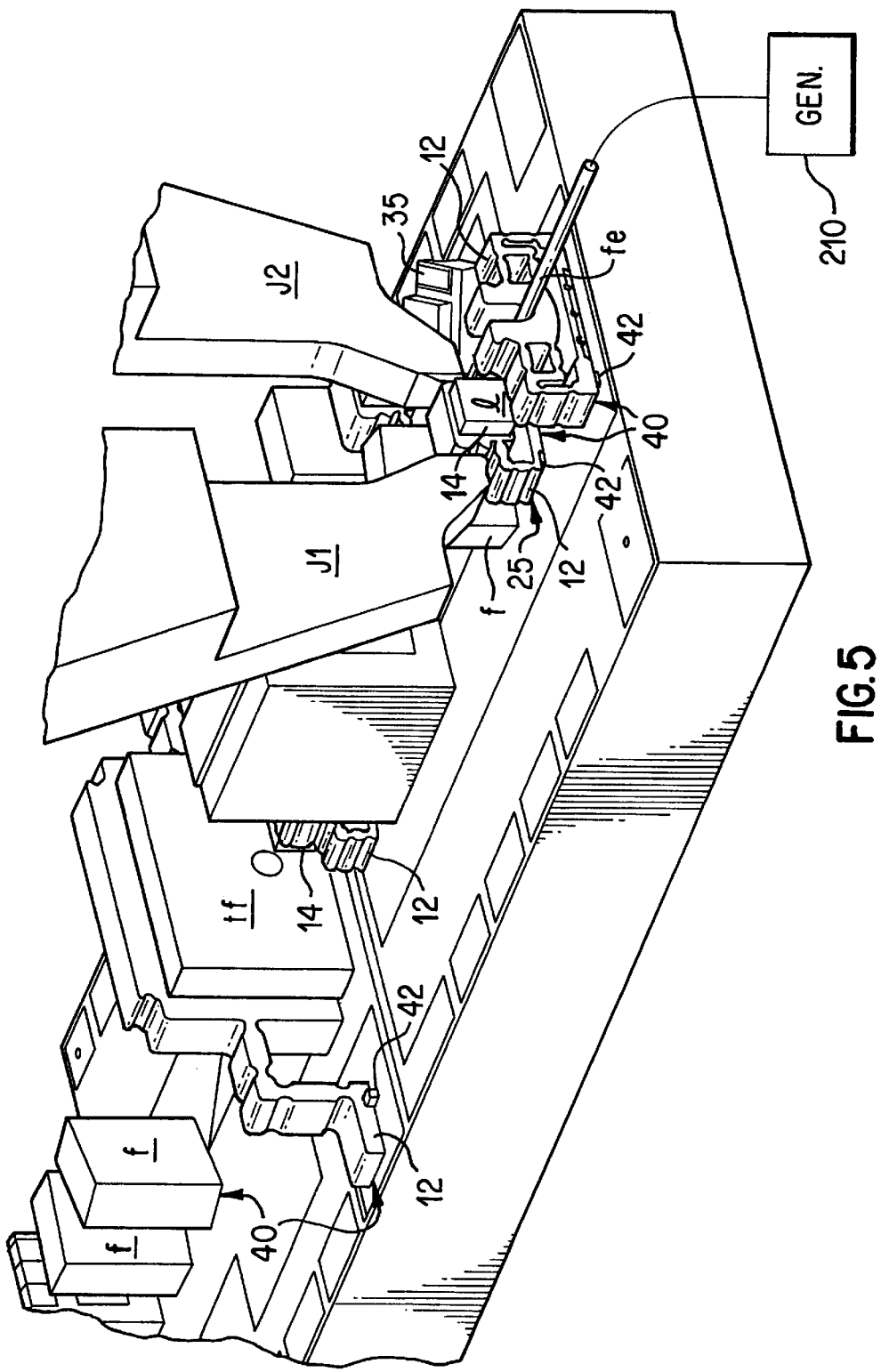
FIG. 5 shows the fine alignment process in which the optical components are plastically deformed to thereby improve the alignment of the system.

This is illustrated in FIG. 5. In the illustrated example, jaws J1, J2 of an alignment system engage the individual optical components 25 and plastically deform the mounting structures 12 of the optical components to improve their alignment relative to the optical system 10.

As also illustrated by FIG. 5, this alignment can be an active alignment process where an optical signal generator 210 is used to generate an optical signal that interacts with the optical element (lens) 14 of the optical component 25. The alignment is then performed relative to the optical signal after interaction with the optical component.

In an alternative implementation, metrology data are collected which indicates the actual positions of the optical components 25 on the optical bench 5. The alignment system then plastically deforms the optical components 25 relative to this metrology data and additional data that dictate the desired positions of the optical components relative to the optical benches and/or relative to other optical components.

While this invention has been particularly shown and described with references to preferred embodiments thereof, it will be understood by those skilled in the art that various changes in form and details may be made therein without departing from the scope of the invention encompassed by the appended claims.

What is claimed is:

1. A process for assembling micro optical systems, comprising:
   depositing bond pads at locations on an optical benche determined by intended engagement points between optical components and the optical benche;
   placing optical components on the bond pads;
   performing a solder reflow process to join the optical components to the optical benche using the bond pads while allowing self alignment of the optical components that is initiated by solder surface tension; and
   after solidification of the solder, improving alignment of the optical components by plastically deforming the optical components on the optical benche.

2. A process as claimed in claim 1, wherein the solder reflow process results in positioning of the optical components to an accuracy of between 2 and 10 micrometers.

3. A process as claimed in claim 1, wherein the step of improving the alignment comprises plastically deforming the optical components to align the optical components to better than a micrometer.

4. A process as claimed in claim 3, wherein the step of plastically deforming the optical components comprises directing optical signals at the optical components and deforming the optical components in response to the optical signals after interaction with the optical components.

5. A process as claimed in claim 1, further comprising depositing solder onto feet of the optical components.

6. A process as claimed in claim 1, further comprising positioning solder preforms between feet of the optical components and the bond pads of the bench.

7. A process as claimed in claim 1, wherein the step of placing the optical components on the bond pads comprises manually placing the optical components on the bond pads using vacuum wands.

8. A process as claimed in claim 1, wherein the step of placing the optical components on the bond pads comprises registering the optical components against registration features on the optical benche or on a template.

9. A process as claimed in claim 1, wherein the step of placing the optical components on the bond pads comprises placing the optical components using a pick-and-place machine.

10. A process as claimed in claim 1, further comprising tack bonding the optical components to the benche prior to the step of performing the solder reflow process.

11. A process as claimed in claim 1, further comprising fixturing the optical components to the optical benche with a magnetic field at least after the placing step.

12. A process as claimed in claim 1, wherein the step of plastically deforming the optical components comprises deforming the optical components in response to metrology data describing positions of the optical components relative to the benche and desired positions of the optical components.

13. A process as claimed in claim 1, wherein the solder pads comprise gold.

14. A process as claimed in claim 1, wherein the solder pads comprise tin.

15. A process as claimed in claim 1, wherein the solder pads comprise indium.

16. A process for assembling micro optical systems, comprising:
   placing optical components on an optical benche;
   registering the optical components against registration features on the optical benche or on a template;
   joining the optical components to the optical benche; and
   after the optical components have been joined to the optical benche, improving alignment of optical components by plastically deforming the optical components.

17. A process as claimed in claim 16, wherein the step of plastically deforming the optical components comprises directing optical signals at the optical components and deforming the optical components in response to the optical signals after interaction with the optical components.

18. A process as claimed in claim 16, wherein the step of joining the optical components comprises solder bonding the optical components to the optical benche.

* * * * *